US008581250B2

(12) United States Patent
Chen

(10) Patent No.: US 8,581,250 B2
(45) Date of Patent: Nov. 12, 2013

(54) METHOD AND APPARATUS OF FABRICATING A PAD STRUCTURE FOR A SEMICONDUCTOR DEVICE

(75) Inventor: Hsien-Wei Chen, Sinying (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 17 days.

(21) Appl. No.: 12/977,160

(22) Filed: Dec. 23, 2010

(65) Prior Publication Data

US 2012/0161129 A1    Jun. 28, 2012

(51) Int. Cl.
*H01L 23/488* (2006.01)
(52) U.S. Cl.
USPC .......... 257/48; 257/782; 257/E23.02
(58) Field of Classification Search
USPC ...................... 257/48, 782, E23.02
See application file for complete search history.

(56) References Cited

U.S. PATENT DOCUMENTS

2007/0096313 A1*  5/2007  Chou et al. .................. 257/737
2007/0290371 A1* 12/2007  Chen ............................ 257/784
2010/0276816 A1* 11/2010  Ali et al. ..................... 257/782

* cited by examiner

*Primary Examiner* — Tran Tran
(74) *Attorney, Agent, or Firm* — Haynes and Boone, LLP

(57) ABSTRACT

The present disclosure involves a semiconductor device. The semiconductor device includes a substrate and an interconnect structure that is formed over the substrate. The interconnect structure has a plurality of metal layers. A first region and a second region each extend through both the interconnect structure and the substrate. The first and second regions are mutually exclusive. The semiconductor device includes a plurality of bond pads disposed above the first region, and a plurality of probe pads disposed above the second region. The semiconductor device also includes a plurality of conductive components that electrically couple at least a subset of the bond pads with at least a subset of the probe pads. Wherein each one of the subset of the bond pads is electrically coupled to a respective one of the subset of the probe pads through one of the conductive components.

20 Claims, 8 Drawing Sheets

METHOD AND APPARATUS OF FABRICATING A PAD STRUCTURE FOR A SEMICONDUCTOR DEVICE

BACKGROUND

The semiconductor integrated circuit (IC) industry has experienced rapid growth in recent years. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Bond pad (or bonding pad) structures have been used to establish electrical connections between components on an IC chip and external devices. Traditionally, each bond pad has an area reserved for the formation of a bonding ball or bump, as well as a separate area reserved for probe testing. An interconnect structure is formed below the bond pad structure. However, as IC device sizes continue to shrink, the region of the interconnect structure under the area reserved for probe testing is typically too small to be used for circuit routing. This results in wasted space within the interconnect structure, and consequently reduces the efficiency of the IC and increases fabrication costs.

Therefore, while existing methods of fabricating bond pad structures for semiconductor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
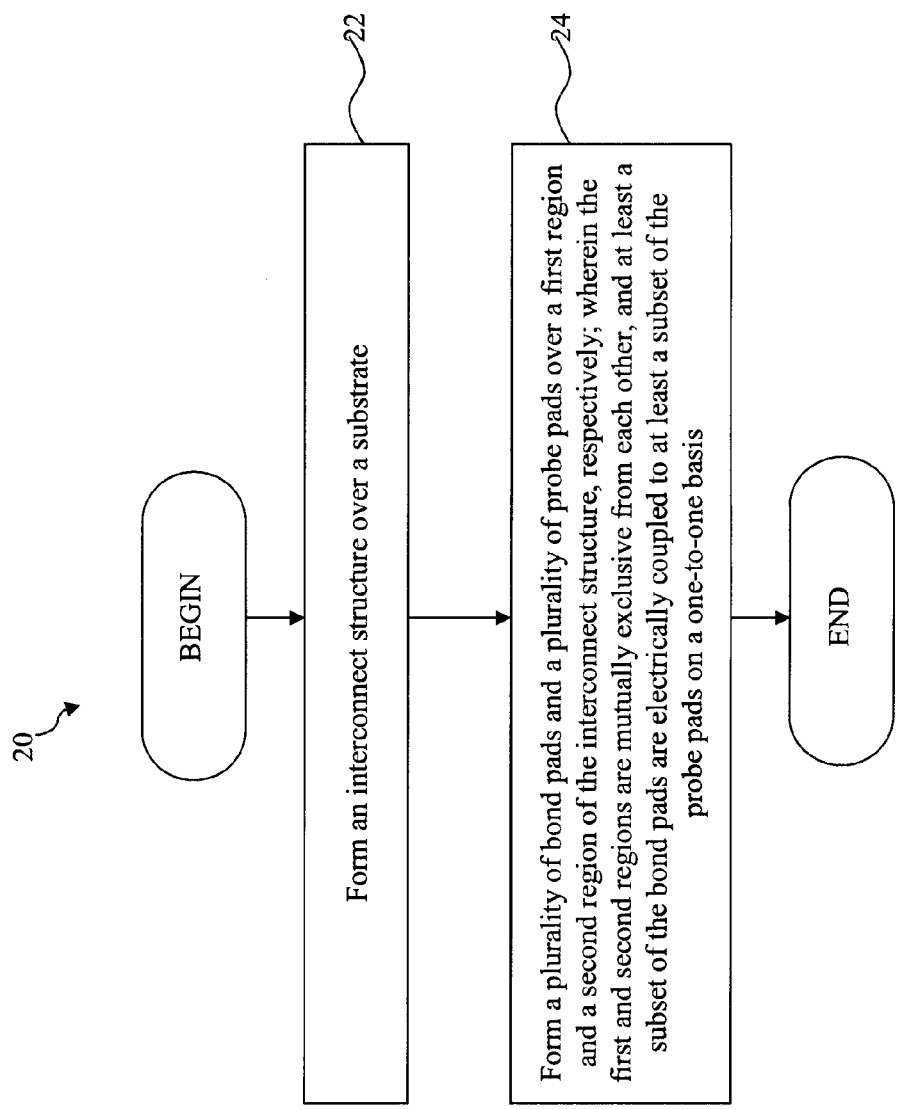
FIG. 1 is a flow chart of fabricating a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 20 for fabricating a semiconductor device according to various aspects of the present disclosure. The method 20 begins with block 22 in which an interconnect structure is formed over a substrate. The interconnect structure has a plurality of metal layers. The method 20 continues with block 22, in which a plurality of bond pads and a plurality of probe pads are formed over a first region and a second region of the interconnect structure, respectively. The first and second regions are mutually exclusive from each other. At least a subset of the bond pads are electrically coupled to at least a subset of the probe pads on a one-to-one basis.

Figure 2:
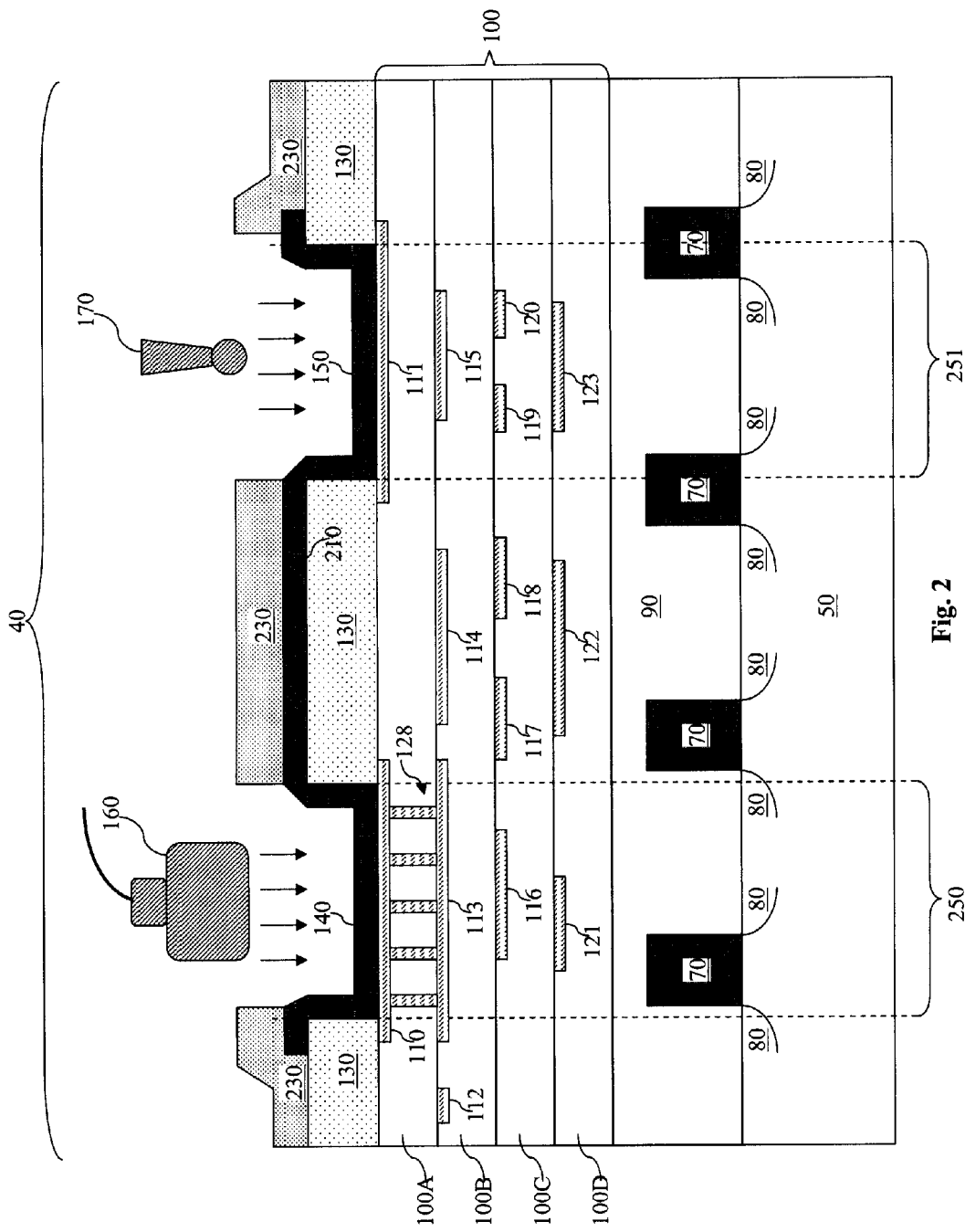
FIGS. 2-4 are respective diagrammatic cross-sectional views of semiconductor devices fabricated with different embodiments according to various aspects of the present disclosure.
Figure 3:
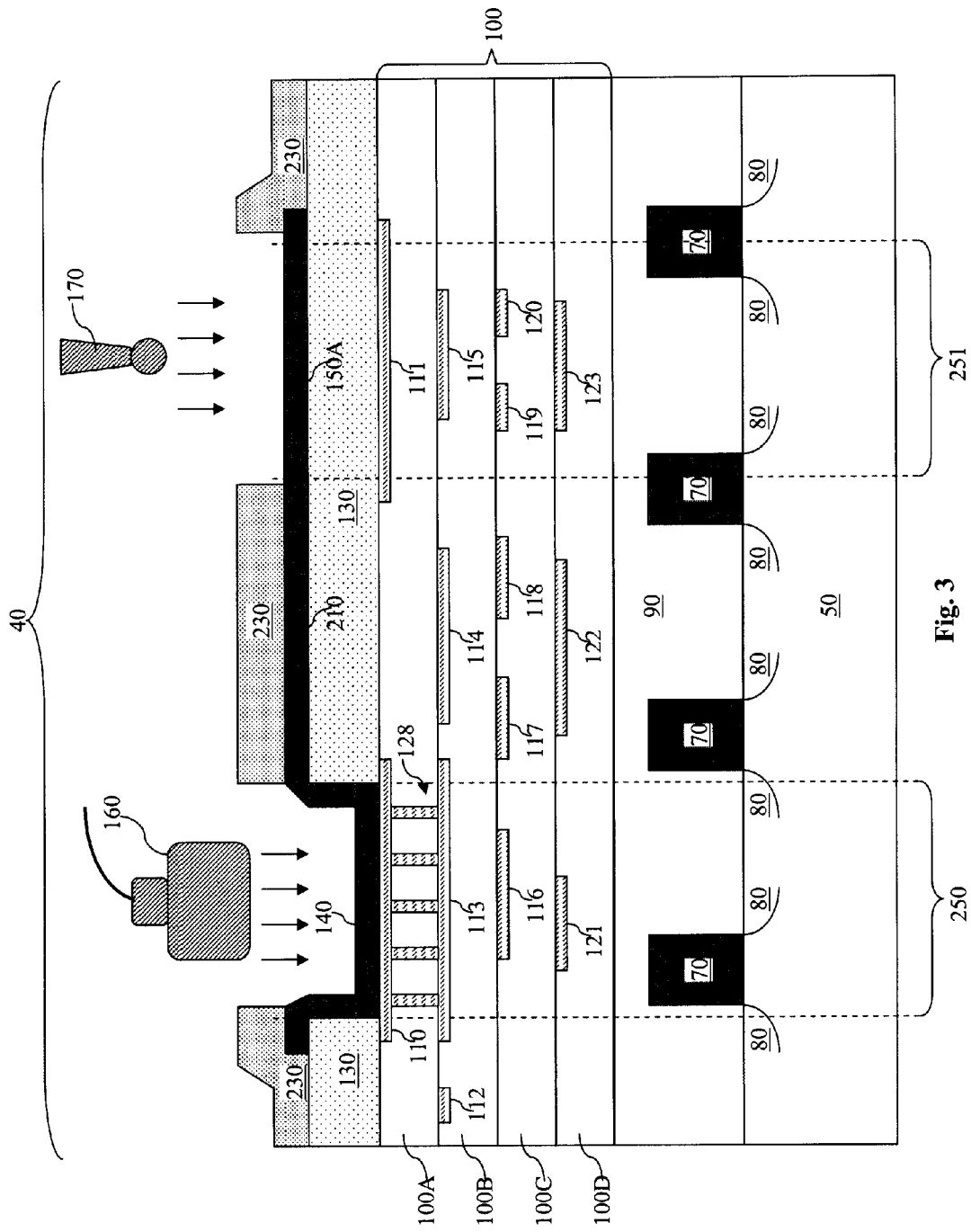
Figure 4:
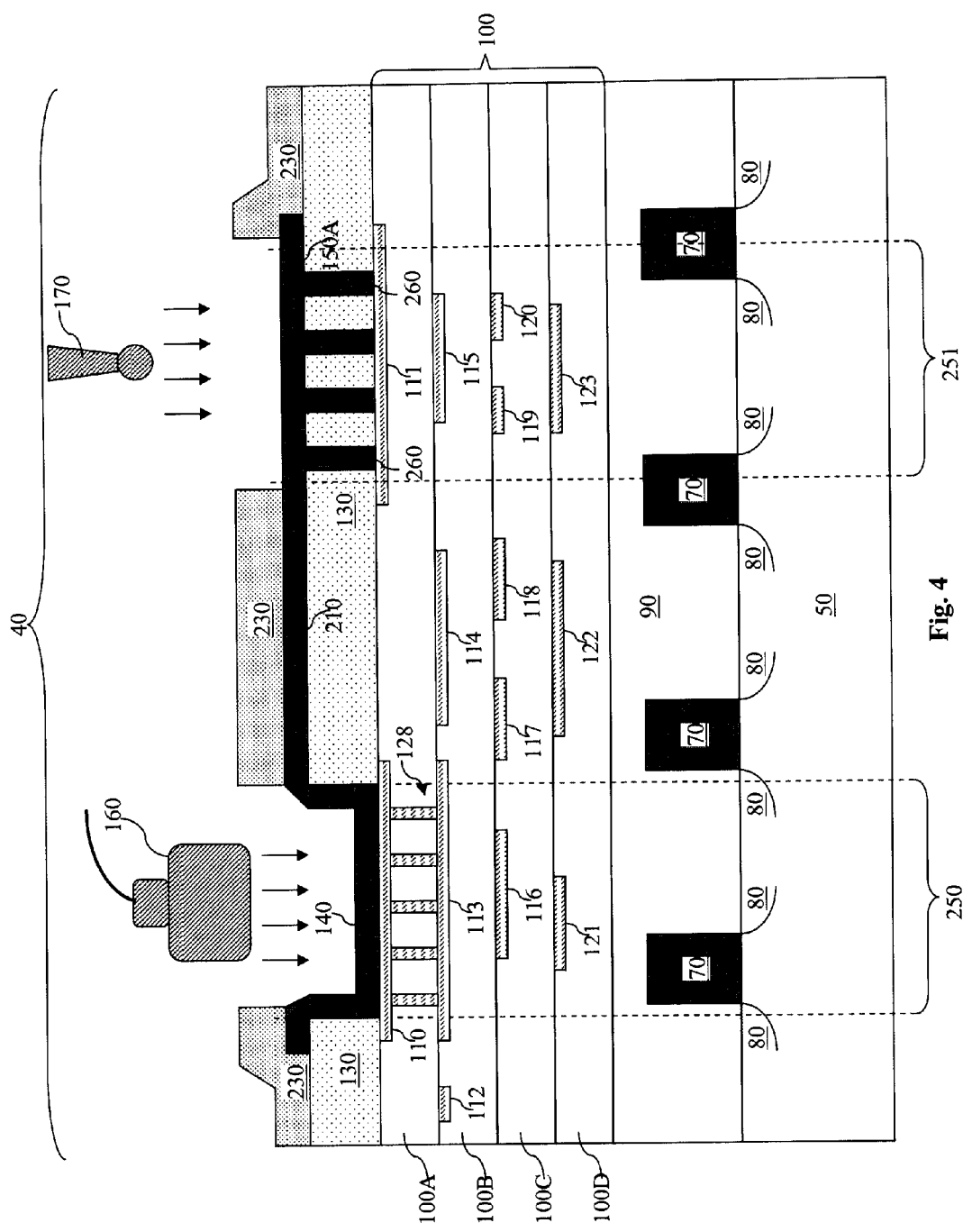

FIGS. 2-4 are diagrammatic fragmentary cross-sectional side views of a semiconductor device 40 in accordance with various embodiments of the present disclosure. It is understood that FIGS. 2-4 have been simplified for a better understanding of the inventive concepts of the present disclosure. Accordingly, it should be noted that additional processes may be provided before, during, and after the processes shown in FIGS. 2-4, and that some other processes may only be briefly described herein.

Referring to FIG. 2, the semiconductor device 40 is a semiconductor IC chip, of which only a portion is shown here. The semiconductor device 40 includes a substrate 50. In one embodiment, the substrate 50 is a silicon substrate that is doped with a P-type dopant such as boron. In another embodiment, the substrate 50 is a silicon substrate that is doped with an N-type dopant such as arsenic or phosphorous.

Isolation structures such as shallow trench isolation (STI) devices are formed in the substrate 50. The STI device includes a dielectric material, which may be silicon oxide or silicon nitride. The STI device is formed by etching a trench in the substrate 50 and thereafter filling the trench with the dielectric material. Also, doped wells are also formed in the substrate 50 using one or more ion implantation processes known in the art. For the sake of simplicity and clarity, these isolation structures and doped wells are not specifically illustrated herein.

A plurality of gates 70 are formed over the substrate 50. The gate 70 each include a gate dielectric layer and a gate electrode layer that is formed over the gate dielectric layer. The gate dielectric layer may include an oxide material, or a high-k dielectric material. The high-k material can be defined as a dielectric material having its dielectric constant greater than about 3.9, that of a thermal silicon oxide. For example, the high-k dielectric material may include hafnium oxide ($HfO_2$), which has a dielectric constant that is in a range from approximately 18 to approximately 40. Alternatively, the high-k material may include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. The gate electrode layer may include a polysilicon material, or a metal material such as tungsten, aluminum, copper, or combinations thereof. Gate spacers may also be formed on the side walls of the gates 70, but for the sake of simplicity, the gate spacers are not specifically illustrated.

Source/drain regions 80 are formed in the substrate 50 on either side of the gates 70. The source/drain regions 80 may include lightly doped source/drain regions and heavily doped source/drain regions. The lightly doped source/drain regions and the heavily doped source/drain regions may be formed by one or more ion implantation processes or diffusion processes known in the art, or combinations thereof. The source/drain regions 80 and the gates 70 together form transistor devices. When these transistors are turned on and are in operation, conductive channels will be formed underneath the gates 70 and between the source/drain regions 80.

An inter-layer (or inter-level) dielectric (ILD) layer 90 is formed over the substrate 50 and surrounds the gates 70. The ILD layer 90 may be formed by chemical vapor deposition (CVD), high density plasma CVD, spin-on, sputtering, or other suitable methods. In an embodiment, the ILD layer 90 includes silicon oxide. In other embodiments, the ILD layer 90 may include silicon oxy-nitride, silicon nitride, or a low-k material.

An interconnect structure 100 is formed over substrate 50 and over the gates 70. The interconnect structure 100 includes a plurality of interconnect layers (also referred to as metal layers M1, M2, M3, etc.) that provide interconnections (e.g., wiring) between devices formed within/on the substrate 50 and external devices. For the sake of illustration and providing an example, interconnect layers 100A-100D are shown in FIG. 2C. Each of the interconnect layers 100A-100D includes metal lines (also referred to as conductive lines or interconnect lines). For example, metal lines 110-111 may be formed in the interconnect layer 100A, metal lines 112-115 may be formed in the interconnect layer 100B, metal lines 116-120 may be formed in the interconnect layer 100C, and metal lines 121-123 may be formed in the interconnect layer 100D.

In one embodiment, the interconnect structure 100 is an aluminum interconnect structure. For an aluminum interconnect structure 100, the metal lines may include aluminum, aluminum/silicon/copper alloy, titanium, titanium nitride, tungsten, polysilicon, metal silicide, or combinations thereof. The metal lines may be formed by a process including physical vapor deposition (PVD) (or sputtering), CVD, or combinations thereof. In another embodiment, the interconnect structure 100 is a copper interconnect structure. For a copper interconnect structure 100, the metal lines may include copper, copper alloy, titanium, titanium nitride, tantalum, tantalum nitride, tungsten, polysilicon, metal silicide, or combinations thereof. The metal lines may be formed by a process including CVD, sputtering, plating, or other suitable processes.

Each of the interconnect layers 100A-100D also includes a dielectric material (referred to as inter-metal dielectric) for providing electrical isolation. The dielectric material includes silicon oxide in one embodiment. In other embodiments, the dielectric material may include fluorosilicate glass (FSG), low-k materials, or combination thereof. The low-k material can be defined as a dielectric material having its dielectric constant less than 3.9, that of a thermal silicon oxide. The low-k materials may include carbon-doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other materials.

The gates 70 and the layer 100D are interconnected together by a plurality of conductive contacts, and the interconnect layers 100A-100D are interconnected together by a plurality of vias. For example, the metal lines 110 and 113 are interconnected by a plurality of vias 128. For the sake of simplicity, other vias and contacts are not specifically illustrated herein. Each of the contacts/vias may be formed by etching a trench using a photolithography process, and then filling the trench with a conductive material such as metal. In an embodiment, the conductive material may include tungsten. In other embodiments, the conductive material may include copper, titanium, titanium nitride, or combinations thereof.

A passivation layer 130 is formed over the topmost interconnect layer 100A. In one embodiment, the passivation layer 130 includes silicon nitride and may be formed by CVD, PVD, ALD, or combinations thereof. In other embodiments, the passivation layer 130 may include a different material.

Openings are formed in the passivation layer 130 so that a bond pad 140 and a separate probe pad 150 are formed on the metal lines of the topmost interconnect layer 100A. It is understood that a plurality of other bond pads 140 and a plurality of other probe pads 150 are also formed, but for the sake of simplicity, only one of the bond pads 140 and one of the probe pads 150 are shown here. Further, it is understood that the bond pad 140 and the probe pad 150 are not drawn in scale with the other components illustrated in FIG. 2. For example, there may be many more gates 70 or other metal lines than what is shown under the bond pad 140 and the probe pad 150.

The bond pad 140 and the probe pad 150 each include a conductive material and may be formed by a deposition process known in the art, such as CVD, PVD, ALD, or combinations thereof. For example, they may each include aluminum. In other embodiments, they may include other metal materials.

The bond pad 140 is an area reserved for the attachment of bonding devices. For example, a bonding ball 160 (or a bonding bump) may be bonded to the bond pad 140 in a later process, so that electrical connections may be made with external devices. In a similar manner, the probe pad 150 is an area reserved for probe testing. A probe head 170 may make physical contact with the probe pad 150 during probe testing later (after the fabrication of the semiconductor device 40 is complete). The bond pad 140 and the probe pad 150 each have a concave shape in the embodiment shown in FIG. 2, but it is understood that they may have other shapes in other embodiments.

Also as is shown in FIG. 2, the probe pad 140 and the bond pad 150 are electrically coupled by a conductive component 210 (also referred to as a connection line). In an embodiment, the conductive component 210 includes the same materials as the bond pad 140 and the probe pad 150, and may be formed by the same process that forms the bond pad 140 and the probe pad 150. In other embodiments, the conductive component 210 may include a conductive material different from that of the bond pad 140 and the probe pad 150, and may be formed by different fabrication processes.

A passivation layer 230 is formed over the passivation layer 130 and over portions of the bond pad 140 and the probe pad 150. The passivation layer 230 may include a similar material as the passivation 130, or a different material.

To facilitate the ensuing discussions, a region/area of the interconnect structure 100 (and of the substrate 50) located below the bond pad 140 is conceptually designated and referred to as a region/area 250, and a region/area of the interconnect structure 100 (and of the substrate 50) located below the probe pad 150 is conceptually designated and referred to as a region/area 251. One or more metal lines is formed in the regions 250-251 in each of the interconnect layers 100A-100D. For example, the metal line 115 is formed in the region 251 below the probe pad 150 in the interconnect layer 100B, the metal lines 119-120 are formed in the region 251 below the probe pad 150 in the interconnect layer 100C, and the metal line 123 is formed in the region 251 below the probe pad 150 in the interconnect layer 100D. These metal lines may also be referred to as input/output (I/O) cells.

In existing pad structure designs, a single bond pad is used for both bonding purposes and probe testing purposes. For example, one half of the bond pad area may be reserved or designated as a bond area, where a bonding ball or a bonding bump will be bonded. The other half of the bond pad area may be reserved or designated as a probe area, with which a probe head will come into physical contact during probe testing. However, the existing pad structure design has the drawback that a region/area underneath the probe area of the bond pad may be too small to be used for circuit routing. In other words, at least one of the interconnect layers—typically an interconnect layer close to the top interconnect layer—may not have any metal lines formed underneath at all. This drawback reduces the routing efficiency of an IC chip and therefore increases fabrication costs.

Here, the bond pad 140 and the probe pad 150 are physically separated into two different pads, which allows all the interconnect layers 100A-100D within the region 251 below the probe pad 150 to be used for circuit routing. This is accomplished by proper grouping arrangements of the bond pads and the probe pads, and will be discussed later in more detail in conjunction with a top level view showing a plurality of bond pads 140 and a plurality of probe pads 150 in later figures.

FIGS. 3 and 4 each show an alternative embodiment of the pad structure discussed above is shown. For purposes of consistency and clarity, similar components are labeled the same throughout FIGS. 2-4. In the alternative embodiment shown in FIG. 3, a bond pad 140 and a probe pad 150A are formed. The probe pad 150A is similar to the probe pad 150 in that they are each a conductive area with which the probe head 170 will make physical contact. Unlike the probe pad 150 of FIG. 3, the probe pad 150A is substantially flat and does not have a concave shape. The probe pad 150A is still interconnected with the bond pad 140 through the conductive component 210.

In the alternative embodiment shown in FIG. 4, a bond pad 140 and a probe pad 150B are formed. The probe pad 150B is similar to the probe pad 150A (of FIG. 3). The probe pad 150B is electrically coupled to the metal line 111 of the interconnect layer 100A through a plurality of vias 260. Similar to the pad structures shown in FIGS. 2-3, the probe pad 150B is still interconnected with the bond pad 140 through the conductive component 210.

Figure 5:
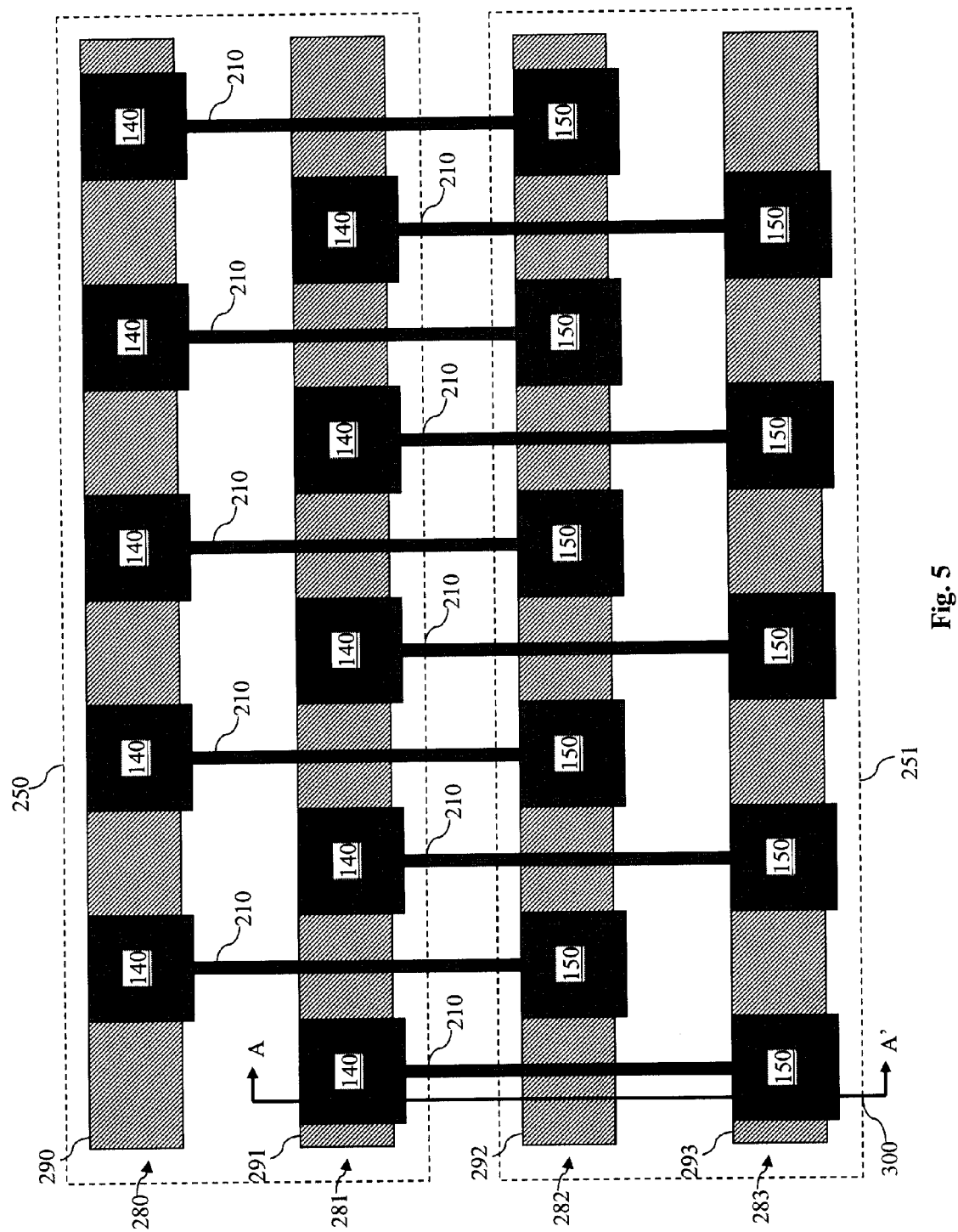
FIGS. 5-8 are respective diagrammatic top views of semiconductor devices fabricated with different embodiments according to various aspects of the present disclosure.

FIG. 5 is a simplified diagrammatic fragmentary top level view of a plurality of bond pads 140 and a plurality of probe pads 150. Referring to FIG. 5, the plurality of bond pads 140 are arranged in two horizontal rows 280-281, and the plurality of probe pads 150 are arranged in two horizontal rows 282-283. The bond pads 140 within each of the rows 280-281 are approximately aligned with each other, and the probe pads 150 within each of the rows 282-283 are approximately aligned with each other.

The bond pads 140 in the row 280 are at least partially overlapping with a metal line 290, and the bond pads 140 in the row 281 are at least partially overlapping with a metal line 291. Similarly, the probe pads 150 in the row 282 are at least partially overlapping with a metal line 292, and the probe pads 150 in the row 283 are at least partially overlapping with a metal line 293. The metal lines 290-293 are metal lines of the interconnect structure 100 shown in FIGS. 2-4. In an embodiment, the metal lines 290-291 may be similar or the same as the metal line 110 shown in FIGS. 2-4, and the metal lines 292-293 may be similar or the same as the metal line 111 shown in FIGS. 2-4. As discussed above, these metal lines 290-293 may also be referred to as I/O cells, because they may provide circuit routing for input/output purposes.

Each of the bond pads 140 is coupled to a respective one of the probe pads 150 through one of the conductive components (connection line) 210 (shown in FIGS. 2-4). Thus, the cross-sectional views of FIGS. 2-4 would be approximately obtained by taking a cross-sectional cut 300 from point A to point A'.

From the top view of FIG. 5, it can be seen that the bond pads 140 and the probe pads 150 are not just merely separated, but that they are separated and arranged in a manner so that the bond pads 140 are grouped together in the region 250 (whose cross-sectional view is shown in FIGS. 2-4), and the probe pads 150 are grouped together in the region 251 (whose cross-sectional view is shown in FIGS. 2-4). The regions 250-251 are illustrated as broken boxes here in FIG. 5. The regions 250-251 are mutually exclusive. In an embodiment, the regions 250-251 each include a continuous area and are each undivided. Also, the boundaries, the sizes, and shapes of the regions 250-251 may vary in different embodiments. The regions 250-251 shown in FIG. 5 are shown merely for the purpose of providing an example, and thus should not be construed to limit the scope of the present disclosure.

The grouping of the bond pads 140 and the probe pads 150 in the respective regions 250-251 is advantageous. In particular, as discussed above, traditional bond pad structures use a single bond pad for both bonding and probing purposes. Consequently, as device sizes shrink, the area underneath the probe area of the bond pad becomes too small to be used for circuit routing, thus no metal lines can be formed underneath. Here, since the bond pads 140 and the probe pads 150 are separated, and the probe pads 150 are grouped in a much bigger region 251, the region 251 under the probe pads 150 is now big enough for circuiting routing. Thus, metal lines such as metal lines 292-293 can be formed in the region 251 underneath the probe pads 150. In this manner, small regions—regions under each of the probe pads 150 and that otherwise would have been too small to be used for circuit routing—are aggregated into the much bigger region 251, where circuit routing can be sufficiently implemented. Meanwhile, the bond pads 140 and the probe pads 150 can still maintain electrical connections through the conductive components 210.

Figure 6:
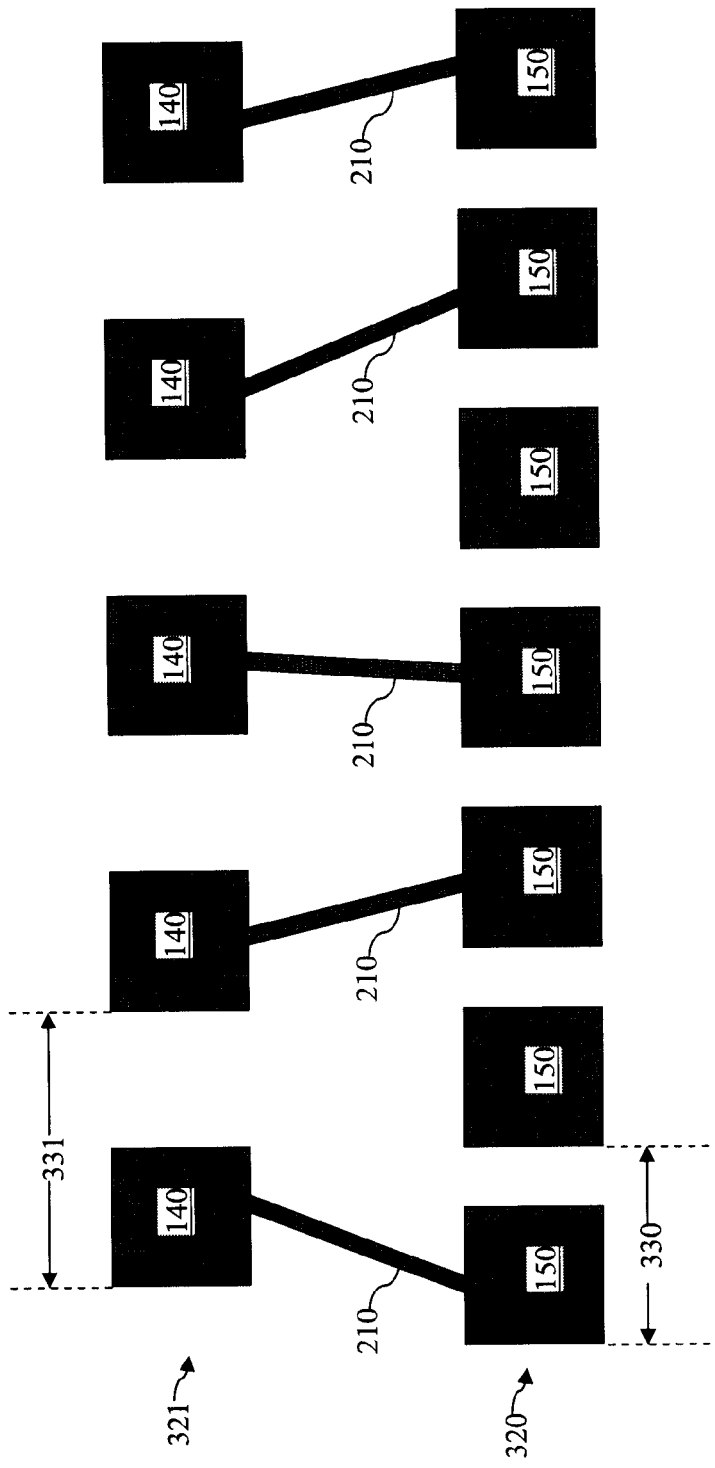

FIG. 6 is another simplified diagrammatic fragmentary top level view of a plurality of bond pads 140 and a plurality of probe pads 150 in accordance with an embodiment of the present disclosure. For the sake of simplicity, neither the regions 250-251 nor the metal lines located below the bond pads 140 and the probe pads 150 are shown. The plurality of probe pads 150 are approximately horizontally aligned with each other in a row 320, and the plurality of bond pads 140 are approximately horizontally aligned with each other in a row 321. The probe pads 150 in the row 320 have a pitch 330, which is measured from one end of a probe pad 150 to the closest end of an adjacent probe pad. In a similar manner, the bond pads 140 in the row 321 have a pitch 331.

The pitches 330 and 331 are different in size. For example, in the embodiment shown in FIG. 6, the pitch 331 is greater than the pitch 330. This means that in the same amount of distance, there are more probe pads 150 than bond pads 140. The opposite may be true in other embodiments. In the embodiment shown in FIG. 6, each of the bond pads 140 is interconnected with a respective one of the probe pads 150 through one of the respective conductive components 210. However, some of the probe pads 150 are dummy probe pads and are not coupled to any of the bond pads 140.

The fact that the bond pads 140 and the probe pads 150 can have different pitches increases the flexibility of the pad structure design. A probe card of a probe testing system may have a certain pitch. Probe testing systems, including the probe card, may be expensive, so it is desirable to reuse the same probe testing system and the same probe card to test many different types of IC devices. However, different IC devices may have different bond pad pitches. Recall that in traditional pad structure designs, a bond pad is used both for bonding and for probe testing. This means that for traditional pad structure designs, the bond pitch is fixed to the probe pitch, and vice versa. Consequently, as bond pad pitches change, it may be difficult to interface accurately with the same probe card, because the pitch of the probe areas is changing along with the bond pads.

Here, the probe pads 150 can be designed to have the same pitch as the probe card pitch, while the bond pads 140 can be moved around freely to have any pitch suitable for its particular application. Thus, the embodiment shown in FIG. 6 is more flexible and allows a single probe card to be reused and to interface with many different types of IC devices. Also, the probe card may have extra probe heads that are not really required for the probe testing of a particular IC device. Nevertheless, these extra probe heads may cause damage to the IC device during probe testing if they are not properly contacted. Here, the dummy probe pads 150 that are not coupled to any of the bond pads 140 can be used to properly contact the extra probe heads. Therefore, potential damage to the IC device during probe testing can be avoided.

Figure 7:
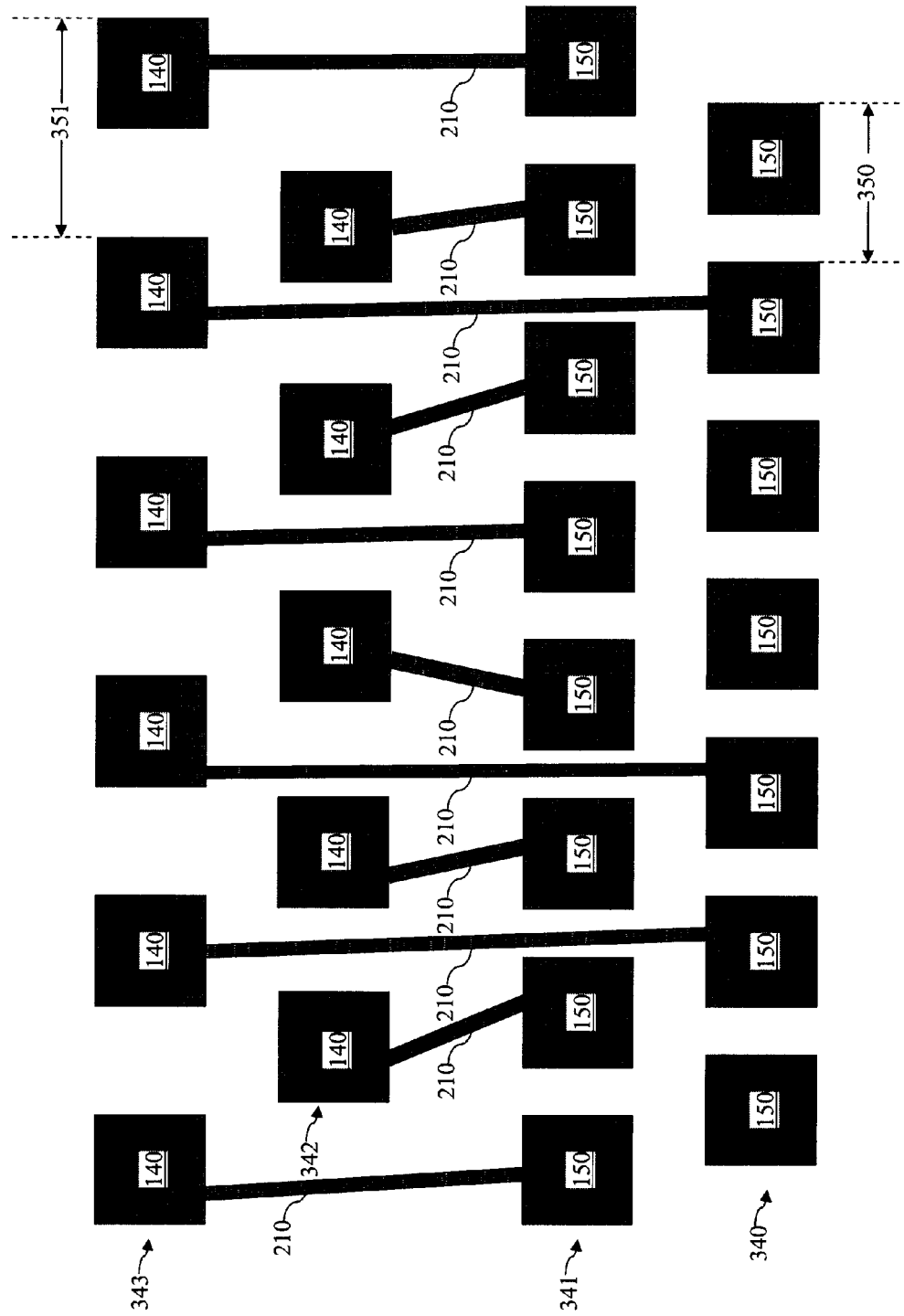

FIG. 7 is one more simplified diagrammatic fragmentary top level view of a plurality of bond pads 140 and a plurality of probe pads 150 in accordance with an embodiment of the present disclosure. Here, the plurality of probe pads 150 are approximately horizontally aligned with each other in two different rows 340 and 341, and the plurality of bond pads 140 are approximately horizontally aligned with each other in two different rows 342 and 343. The probe pads 150 in the rows 340-341 have a pitch 350, and the bond pads 140 in the rows 342-343 have a pitch 351. The pitch 351 is different from the pitch 350. As discussed above, the differing pitches offer flexibility in interfacing with probe cards. In addition, in each of FIGS. 6-7, the grouping of the probe pads 150 allows circuit routing to be implemented underneath the probe pads 150, therefore routing efficiencies can be improved, and no IC chip area may be wasted.

Figure 8:
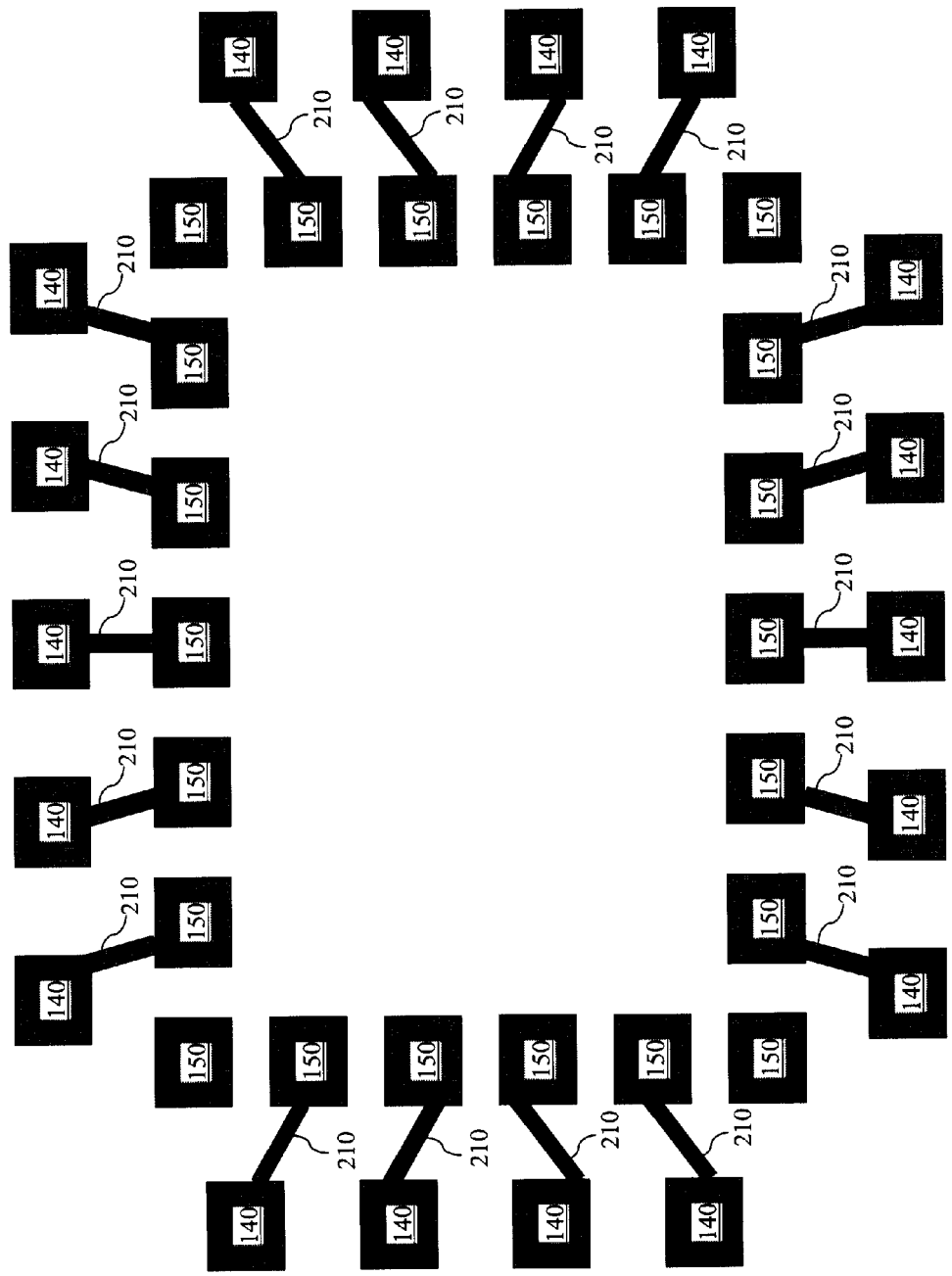

FIG. 8 is yet one more simplified diagrammatic fragmentary top level view of a plurality of bond pads 140 and a plurality of probe pads 150 in accordance with an embodiment of the present disclosure. The bond pads 140 are arranged into two rows and two columns, as are the probe pads 150. The two rows and two columns of probe pads 150 roughly form a rectangular shape. The probe pads 150 are collectively (and at least partially) surrounded by the bond pads 140 on all four sides. The bond pads 140 are each coupled to a respective one of the probe pads 150 through one of the respective conductive components 210. The bond pads 140 have different pitches from the probe pads 150.

Similar to the embodiments discussed above, the embodiment illustrated in FIG. 8 also has the advantage of allowing circuit routing underneath the probe pads 150 due to aggregation of the probe pads 150, as well as flexible interfacing with respect to probe cards as a result of the pitches being different for the bond pads 140 and for the probe pads 150.

Thus, the embodiments of the present disclosure offer advantages over existing pad structures, it being understood that different embodiments may offer different advantages, and that no particular advantage is required for all embodiments. One of the advantages is more efficient and flexible circuit routing. In particular, the bond pads and the probe pads are physically separated into two different pads, and all the probe pads are configured and placed above the same region of the interconnect structure (and of the substrate). Thus, even though the region under a single probe pad may have been too small for circuit routing, the combined regions under all the probe pads altogether is sufficiently large so that circuit routing can be implemented in that region. Metal lines (also referred to as I/O cells) can therefore be formed in the region of the interconnect structure underneath the group of probe pads. This may help reduce device size and increase routing efficiency, as well as conserve valuable IC chip area.

Further, in some of the embodiments described above, the bond pads and the probe pads have different pitches. The different pitches allow flexible interfacing with probe cards. For example, the same probe card can be reused for different IC devices, because they are no longer dependent on the particular pad structure (and bond pad pitch size) of each IC device.

In addition, the methods of forming the bond pads and the probe pads are compatible with (and can easily be integrated into) existing process flow. Thus, no extra costs will be incurred to implement the various aspects of the present disclosure.

One of the broader forms of the present disclosure involves a semiconductor device. The semiconductor device includes: a substrate that includes a first region and a second region different from the first region; a plurality of bond pads located over the first region; and a plurality of probe pads located over the second region; wherein at least some of the bond pads are electrically coupled together with at least some of the probe pads.

Another one of the broader forms of the present disclosure involves a semiconductor device. The semiconductor device includes: a substrate; an interconnect structure formed over the substrate, the interconnect structure having a plurality of metal layers; a plurality of bond pads disposed above a first area of the interconnect structure; a plurality of probe pads disposed above a second area of the interconnect structure, the first and second areas being mutually exclusive from each other; and a plurality of conductive components that electrically couple at least a subset of the bond pads with at least a subset of the probe pads, wherein each one of the subset of the bond pads is electrically coupled to a respective one of the subset of the probe pads through one of the conductive components.

Yet another one of the broader forms of the present disclosure involves a method of fabricating a semiconductor device. The method includes: forming an interconnect structure over a substrate, the interconnect structure having a plurality of metal layers; and forming a plurality of bond pads and a plurality of probe pads over a first region and a second region of the interconnect structure, respectively; wherein: the first and second regions are mutually exclusive from each other; and at least a subset of the bond pads are electrically coupled to at least a subset of the probe pads on a one-to-one basis.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
a substrate that includes a first region and a second region different from the first region;
a first passivation layer formed over the first region and the second region;
a plurality of bond pads embedded in the first passivation layer located over the first region; and
a plurality of probe pads embedded in the first passivation layer located over the second region;
a conductive feature continuously extending over the first passivation layer from one of the plurality of bond pads to one of the plurality of probe pads to electrically couple the one of the plurality of bond pads to the one of the plurality of probe pads; and
a second passivation layer disposed directly on a portion of the conductive feature such that the second passivation layer physically contacts the portion of the conductive feature,
wherein the plurality of bond pads are separated from the plurality of probe pads, and wherein at least some of the bond pads are electrically coupled together with at least some of the probe pads.

2. The semiconductor device of claim 1, wherein the bond pads and the probe pads that are electrically coupled are coupled together on a one-to-one basis.

3. The semiconductor device of claim 1, further including: a plurality of interconnect layers formed over the substrate, wherein the interconnect layers each include a metal line that is located above the second region.

4. The semiconductor device of claim 1, wherein the bond pads have a different pitch from the probe pads.

5. The semiconductor device of claim 1, wherein:
the bond pads include at least two rows of bond pads located over the first region; and
the probe pads include at least two rows of probe pads located over the second region.

6. The semiconductor device of claim 1, wherein one of the first and second regions is at least partially surrounded by the other.

7. The semiconductor device of claim 1, wherein the first and second regions are each undivided.

8. The semiconductor device of claim 1, wherein the probe pads each have a concave shape from a cross-sectional view.

9. The semiconductor device of claim 1, wherein the passivation layer has a top surface and a bottom surface, the top surface being in contact with the probe pads;
and further including: a plurality of vias that extend through the top and bottom surfaces of the passivation layer.

10. A semiconductor device, comprising:
a substrate;
an interconnect structure formed over the substrate, the interconnect structure having a plurality of metal layers, wherein the plurality of metal layers includes a first metal line and a second metal line that is different from the first metal line;
a plurality of bond pads disposed above a first area of the interconnect structure and physically contacting the first metal line, wherein the plurality of bond pads includes a first bond pad;
a plurality of probe pads disposed above a second area of the interconnect structure and physically contacting the second metal line, the first and second areas being mutually exclusive from each other, wherein the plurality of probe pads includes a first probe pad;
a plurality of conductive components that electrically couple at least a subset of the bond pads with at least a subset of the probe pads, wherein each one of the subset of the bond pads is electrically coupled to a respective one of the subset of the probe pads through one of the conductive components, wherein the plurality of conductive components includes a first conductive component that continuously extends over the interconnect structure from the first bond pad to the first probe pad to electrically couple the first bond pad to the first probe pad; and
a passivation layer disposed directly on a top surface of the first conductive component such that the passivation layer physically contacts the top surface of the first conductive component, wherein the top surface of the first conductive component faces way from the substrate.

11. The semiconductor device of claim 10, wherein:
at least some of the bond pads are aligned with one another; and
at least some of the probe pads are aligned with one another.

12. The semiconductor device of claim 10, wherein the probe pads are collectively surrounded by the bond pads.

13. The semiconductor device of claim 10, wherein:
a first pitch exists for the bond pads;
a second pitch exists for the probe pads; and
the first pitch is different from the second pitch.

14. The semiconductor device of claim 10, wherein the bond pads, the probe pads, and the conductive components all include the same material.

15. The semiconductor device of claim 10, wherein:
both the first area and the second area are continuous areas; and
an interconnect line exists in each of the metal layers within the second area.

16. A semiconductor device comprising:
a substrate;
an interconnect structure formed over the substrate, the interconnect structure having a plurality of metal layers;
a first row of bond pads and a second row of bond pads disposed above a first area of the interconnect structure; and
a first row of probe pads and a second row of probe pads disposed above a second area of the interconnect structure, the first and second areas being mutually exclusive from each other, wherein each probe pad from the first row of probes is aligned with and electrically coupled to a respective bond pad from the first row of bonding pads and wherein each probe pad from the second row of probes is aligned with and electrically coupled a respective bond pad from the second row of bonding pads, wherein the first row of bond pads and the first row of probe pads are positioned between the second row of bond pads and the second row of probe pads.

17. The semiconductor device of claim 16, wherein the first row of bond pads is positioned closer to the first row of probe pads than the second row bond pads.

18. The semiconductor device of claim 16, further comprising a passivation layer formed over the first area and the second area, and
wherein the first and second rows of the bond pads are embedded in the passivation layer located over the first area, and
wherein the first and second rows of the probe pads are embedded in the passivation layer located over the second area.

19. The semiconductor device of claim 16, further comprising a first metal line, a second metal line, a third metal line, and a fourth metal line, wherein the first metal, the second metal line, the third metal line, and the fourth metal line are different from each other,
   wherein the first row of bond pads physically contacts the first metal line,
   wherein the second row of bond pads physically contacts the second metal line,
   wherein the first row of probe pads physically contacts the third metal line, and
   wherein the second row of bond pads physically contacts the fourth metal line.

20. The semiconductor device of claim 1, wherein the plurality of bond pads includes a first row of bond pads and a second row of bond pads located over the first region,
   wherein the plurality of probe pads includes a first row of probe pads and a second row of probe pads located over the second region,
   wherein each probe pad from the first row of probes is aligned with and electrically coupled to a respective bond pad from the first row of bonding pads and wherein each probe pad from the second row of probes is aligned with and electrically coupled a respective bond pad from the second row of bonding pads, and
   wherein the first row of bond pads and the first row of probe pads are positioned between the second row of bond pads and the second row of probe pads.

* * * * *